United States Patent [19]
Chakraborty et al.

[11] Patent Number: 6,167,542
[45] Date of Patent: Dec. 26, 2000

[54] ARRANGEMENT FOR FAULT DETECTION IN CIRCUIT INTERCONNECTIONS

[75] Inventors: Tapan Jyoti Chakraborty, West Windsor; Bradford Gene VanTreuren, Lambertville, both of N.J.

[73] Assignee: Lucent Technologies, Murray Hill, N.J.

[21] Appl. No.: 09/197,977

[22] Filed: Nov. 23, 1998

[51] Int. Cl.[7] .................................................. G11C 29/00
[52] U.S. Cl. ................................................................ 714/720
[58] Field of Search .................................. 714/720, 728, 714/738

[56] References Cited

U.S. PATENT DOCUMENTS

| | | | |
|---|---|---|---|
| 4,204,633 | 5/1980 | Goel | 714/738 |
| 4,594,711 | 6/1986 | Thatte | 714/728 |
| 4,829,520 | 5/1989 | Toth | 714/724 |
| 5,257,268 | 10/1993 | Agrawal et al. | 714/738 |

*Primary Examiner*—Phung M. Chung
*Attorney, Agent, or Firm*—Henry T Brendzel

[57] ABSTRACT

Testing time of interconnections is reducted by splitting up the collection of connection paths to be tested into two or more groups. A set of test vectors, which is applied to each of the groups concurrently, is arranged to insure that the two adjacent connections that are assigned to different groups are not tested concurrently. The user can select the number of groups, and the number of connection paths within each group (which need not be the same for all groups). The disclosed algorithm increases the number of connection paths that are tested with each concatenated test vector, and consequently the number of required test vectors is reduced.

16 Claims, 2 Drawing Sheets

```
0 0 0 0 0 0 0 0        0 0 0 0 | 0 0 0 0
0 0 0 0 0 0 0 1        0 0 0 1 | 0 0 0 1
0 0 0 0 0 0 1 0        0 0 1 0 | 0 0 1 0
0 0 0 0 0 1 0 0        0 1 0 0 | 0 1 0 0
0 0 0 0 1 0 0 0        1 0 0 0 | 1 0 0 0
0 0 0 1 0 0 0 0        0 0 0 0 | 0 0 0 0
0 0 1 0 0 0 0 0
0 1 0 0 0 0 0 0
1 0 0 0 0 0 0 0
0 0 0 0 0 0 0 0
```

ARRANGEMENT FOR FAULT DETECTION IN CIRCUIT INTERCONNECTIONS

RELATED APPLICATION

This application is somewhat related to an allowed application of W. Ke, Ser. No. 08/733,592, filed Oct. 18, 1996, titled "Methods for Backplane Interconnect Testing" which is now as U.S. Pat. No. 5,841,788.

BACKGROUND OF THE INVENTION

This invention is related to testing of electronic systems.

In the circuit design of many systems, and particularly interconnections between circuit modules (such as two or more circuit boards interconnected via connection terminals on a backplane or through a cable), significant efforts are made to efficiently facilitate operational testing of the connections. Operational testing refers to the testing of the interconnections to determine whether there are shorts or opens. Simply, operational testing consists of sending a test signal from one circuit module to another and determining whether the signal received is the same as the signal that was sent.

Typically, such a method of testing the interconnections between circuit boards would be facilitated by a test module placed on each board. These modules incorporate 1) the software necessary to perform the test, 2) a control (or time synchronization) unit, 3) memory, and 4) a method for communicating with the tester. Once a command signal to initiate the test is received by the test module, the control unit then synchronizes itself with test modules on other circuit boards and begins the test to detect and diagnose possible faults.

In order to test the interconnection between systems on a board for every possible fault, it is necessary to transmit and receive a test signal (hereafter called a "test vector") for all states at which the set of interconnection paths has a single connection at logic level "1". This procedure is at the heart of the test and consumes the most time.

One prior art algorithm which generates a set of test vectors is called a walking-enable algorithm (sometimes called a 'walking-one' algorithm) and has driven several other testing mechanisms, such as those described in U.S. Pat. No. 5,107,501 issued on Apr. 2, 1990, U.S. Pat. No. 5,257,268 issued on Mar. 22, 1990, and U.S. Pat. No. 5,305,328 issued on Oct. 22, 1990.

The standard walking-one algorithm is very simple. It generates a test vector with N-number of bits (with N equal to the number of connection paths to be tested) and changes each from logic 0 to logic 1 and back again, one at a time. The problem with this process is that it requires many steps. However, after analyzing each signal received as a result of applying a test vector, it is possible to detect shorts or opens. For example, if a 3-bit test vector sent as 001, but was received as 000, one would determine that the third connection path was either open or shorted to ground ("stuck-at zero"). Similarly, a test vector sent as 000, but appearing as 001, would indicate that the third connection path is shorted to the power supply ("stuck-at one").

Another fault that can be detected using this method is a short between two connection paths. For example, a test vector sent as 001 but received at 011 would indicate that the second and third connection paths are shorted to each other.

SUMMARY OF THE INVENTION

Realizing that it is highly unlikely for two connection paths that are physically far apart to be shorted to each other, the present invention reduces testing time by splitting up the collection of connection paths to be tested into two or more groups. Then, a set of test vectors for each of the groups is created, and the sets of vectors are applied to the groups concurrently. When the set of connections is split into two groups, and the split set necessarily includes a connection path in group one that is adjacent to a connection path in group two, the sets of test vectors are arranged to insure that the two adjacent connections are not tested concurrently. The user can select the number of groups, and the number of connection paths within each group (which need not be the same for all groups). The test vectors created for each group and applied concurrently can be viewed as a single set of test vectors that result from a concatenation of the group of test vectors.

The disclosed algorithm increases the number of connection paths that are tested with each concatenated test vector, and consequently the number of required test vectors is reduced.

DETAILED DESCRIPTION

Figure 1:
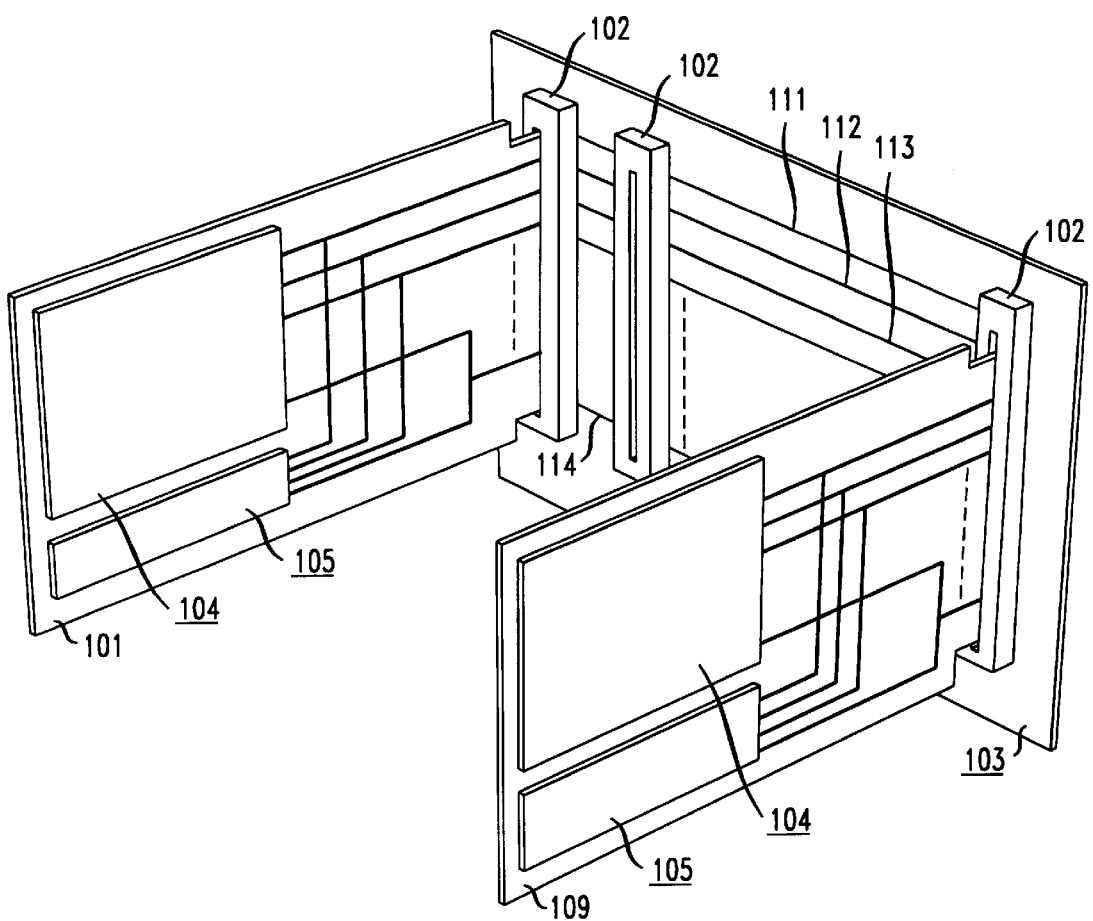
FIG. 1 depicts a system with two circuit boards which are equipped with a test module and plugged into connection terminals which, in turn, are interconnected via a backplane.

FIG. 1 depicts a system with two circuit boards ("CB"s) 101 and 109 interconnected via connection terminal leads within connection terminal blocks 102 on a backplane 103. Each of the circuit boards comprises some functional circuitry 104 that the FIG. 1 system is charged to embody and, additionally, each of the circuit boards includes test circuitry 105. Such a circuit board is disclosed in U.S. Pat. No. 4,829,520, issued to W. Toth on May 9, 1989. More specifically, the circuit boards are interconnected on backplace 103 is via connection paths 111, 112, 113, . . . , 114, and it may be noted that these connection paths may be connected, in a "daisy chain" fashion to some or all of the connection terminals Test circuitry 105 is coupled to all of the leads that connect circuit board 101 to connection terminal blocks 102. Such coupling may be direct, as depicted in FIG. 1, or may be indirect, through a connection between test circuitry 105 and functional circuitry 104. I may be noted that the principles disclosed herein do not depend on all circuit boards 101 being identical, do not depend on all circuit boards 101 being coupled to identically the same connection terminal in terminal blocks 102, and do not depend on the circuit boards having any functional circuitry. The only requirement is that backplane connection paths that are to be tested need to be accessible to the test circuitry on circuit board 101, and need to be accessible to the test circuitry on circuit board 109.

It should be understood that the FIG. 1 system is presented to merely illustrate the principles disclosed herein and that other arrangements can benefit from the algorithm disclosed below, such as arrangements for testing interconnections between circuit modules within a circuit board, etc.

The testing contemplated by the FIG. 1 arrangement is that of paths 111–114. More specifically, it may be desired to test paths 111–114 between every pair of terminal block 102 because, in addition to the fact that such testing provides information between the integrity of paths from connection paths 111–114 to the terminals within the various connection terminal blocks, it also enhances the likelihood of detecting open circuits, i.e., open paths. Without such testing of more than one pair of connection terminal blocks and the connection paths therebetween, an open circuit may be masked as a "stuck at zero" fault.

The testing process itself is conventional. Illustratively, backplane 103 includes a connection path that couples solely to the test circuitry of circuit boards 101 and 109 and through this connection path a user can initiate a testing session. Alternatively, a preset condition occurring at the functional circuit can trigger a testing session. A testing session between circuit board 101 as a sender of signals and circuit board 109 as a receiver of signals needs to be synchronized, of course, between the two circuit boards.

Figures 2, 3:
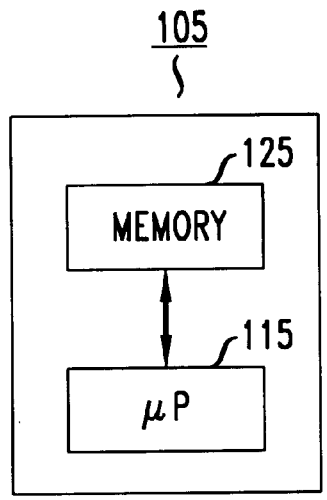
FIG. 2 shows one embodiment of the test circuitry shown in FIG. 1.
FIG. 3 shows one set of test vectors that was generated by a standard walking-one algorithm and a second set of test vectors that was generated by the algorithm disclosed herein.

The arrangement of circuits within test circuitry 105 is also conventional. It is conventional in the sense that it may comprise merely a microprocessor, a memory for storing program information, a memory for storing test results (when the circuitry is used to receive test signals), and perhaps a memory for storing test vectors (when the circuitry is used to send test signals). This is depicted in FIG. 2. It is also conventional in the sense that prior art circuits exist for performing integrity test, as for example disclosed in the aforementioned Toth patent.

Test sequences that are used conventionally are sometimes referred to as "a walking-one algorithm." In such an algorithm, the first test vector comprises zeros on all of the leads (111–114), for example 00000000 sent over 8 leads of backplane 13. The next test vector includes a logic "1" in one connection path, sending the signal 00000001. The next test vector is 00000010, and so forth. This is depicted in the left side of FIG. 3. Clearly, when the number of leads that interconnect the circuit boards is N, the number of test vectors is N+2. Testing all of the connection terminal blocks requires a repeat of the test and, hence, when N is large the test time is also large.

In accordance with the principles disclosed herein, the "walking-one" algorithm is replaced with a windowed walking-enable algorithm, illustrated on the right side of FIG. 3. The notion of the walking-enable algorithm is based on the fact that the probability of a fault involving a short between two connection paths that are physically far apart is essentially zero. With that in mind, it follows that the set of connection paths to be tested can be divided into two or more groups, and the groups can be tested concurrently. The only requirement that is advisable to impose is that connection paths that are close to each should not be tested at the same time. Such a limitation is not difficult to abide by, although it should be recognized that this is an actual limitation. That is, any allocation of the set of connection paths to be tested will necessarily have some paths in each group that are necessarily adjacent to some paths in other groups.

Thus, a walking-enable algorithm creates a set of test vectors consisting of N-bits each. However, unlike the conventional test vectors, the test vector of the walking-enable algorithm can be viewed to comprise a collection of test vector windows, and each such window tests the connection paths of a subset of all N connection paths. Thus, the overall test vector can be thought to comprises distinct segments that, together, form the overall test vector. The right side of FIG. 3 shows the set of test vectors for a two-windows walking-enable algorithm, i.e., there are two segments that form the overall 8 bit test vector. The set consists of only 2+N/2 test vectors and that, of course is smaller than 2+N.

It should be appreciated that the number of windows is selectable by the user. It may also be appreciated that the test pattern applied to one window may be identical to the test pattern that is applied to one or all of the other windows. It may be further appreciated that the test pattern is simple enough to be generated "on the fly" by the microprocessor within the test circuitry and, of course, it could be pre-generated and stored in memory associated with the microprocessor within the test circuitry. Lastly, it may be appreciated that the principles of this invention apply to testing of connection between circuits on a board, between circuits within a single housing, between different circuits on a substrate, and even to interconnection of circuits of a "system on a chip".

We claim:

1. A test unit comprising circuitry for generating a test pattern for testing N leads, the pattern comprising a number of test vectors, where each test vector comprises K segments, and where each segment has a chosen number of bits $N_k$ such that $N_1$, $N_2$, ... $N_K$ add up to N, and each segment includes one and only one logic level "1"; and a processor coupled to said circuitry for effecting transmission of the test pattern to said N leads.

2. The unit of claim 1 where said generating is performed by execution of a process that develops the test pattern.

3. The unit of claim 1 where said generating is performed by accessing a memory.

4. The unit of claim 1 where said generating is performed by accessing a read-only memory.

5. The unit of claim 1 where the K segments have substantially the same number of bits.

6. The unit of claim 5 where each segment has at least 2 bits.

7. The unit of claim 5 where the test vector segments have an identical number of bits.

8. The unit of claim 1 further comprising a receiver for accepting signals from said N leads; and a processor for analyzing signals accepted from said N leads.

9. The unit of claim 8, affixed to a circuit board.

10. The unit of claim 9 where said N leads extend to connector pads on said circuit board.

11. The unit of claim 9 where said circuit board includes functional circuitry that is unrelated to said circuitry for generating a test pattern.

12. The unit of claim 11 where said N leads extend to connections between circuit elements of said functional circuitry.

13. The unit of claim 1 where said circuitry comprises a memory for storing said test pattern.

14. The unit of claim 1 where said circuitry comprises a computing element for creating said test pattern.

15. The unit of claim 14 where said creating occurs concurrently with said transmission.

16. The unit of claim 1 where said test vectors are selected to avoid transmitting a pair of logic levels "1" on adjacent leads of said N leads.

* * * * *